(12) United States Patent
Lucas et al.

(10) Patent No.: US 8,175,737 B2
(45) Date of Patent: May 8, 2012

(54) METHOD AND APPARATUS FOR DESIGNING AND INTEGRATED CIRCUIT

(75) Inventors: Kevin Dean Lucas, Meylan (FR); Robert Elliott Boone, Austin, TX (US); James Edward Vasek, Austin, TX (US); William Louis Wilkinson, Georgetown, TX (US); Christophe Couderc, Eindhoven (NL)

(73) Assignees: Freescale Semiconductor, Inc., Austin, TX (US); Koninklijke Philips Electronics N.V., Eindhoven (NL)

( * ) Notice: Subject to any disclaimer, the term of this patent is extended or adjusted under 35 U.S.C. 154(b) by 576 days.

(21) Appl. No.: 12/374,170

(22) PCT Filed: Jul. 19, 2006

(86) PCT No.: PCT/IB2006/003431
§ 371 (c)(1),
(2), (4) Date: Jan. 23, 2009

(87) PCT Pub. No.: WO2008/010017
PCT Pub. Date: Jan. 24, 2008

(65) Prior Publication Data
US 2009/0240364 A1 Sep. 24, 2009

(51) Int. Cl.
*G06F 19/00* (2006.01)
*G06F 7/60* (2006.01)
*G06F 17/50* (2006.01)
*G06F 1/00* (2006.01)

(52) U.S. Cl. ............. 700/105; 700/121; 703/2; 716/52; 716/136; 430/5

(58) Field of Classification Search .................. 700/105, 700/121; 716/50, 53, 136; 430/5
See application file for complete search history.

(56) References Cited

U.S. PATENT DOCUMENTS

| | | | |
|---|---|---|---|
| 5,325,305 A | 6/1994 | Rezaei | |
| 6,768,958 B2 * | 7/2004 | Ivanovic et al. | 702/94 |
| 7,080,349 B1 * | 7/2006 | Babcock et al. | 716/53 |
| 7,475,382 B2 * | 1/2009 | Melvin et al. | 716/51 |
| 2003/0015674 A1 | 1/2003 | Broermann | |
| 2003/0110465 A1 | 6/2003 | Zhang | |
| 2003/0115034 A1 * | 6/2003 | Tsai et al. | 703/14 |
| 2003/0121021 A1 * | 6/2003 | Liu et al. | 716/19 |
| 2006/0199087 A1 * | 9/2006 | Lucas et al. | 430/30 |

FOREIGN PATENT DOCUMENTS

| | | |
|---|---|---|
| EP | 1424595 A | 6/2004 |
| WO | 2004008245 A | 6/2004 |
| WO | 2006063268 A | 6/2006 |

* cited by examiner

*Primary Examiner* — Michael D Masinick
*Assistant Examiner* — Sivalingam Sivanesan

(57) ABSTRACT

Method and apparatus for designing an integrated circuit by adding a plurality of control points to an integrated circuit wafer design. Each control point has at least one attribute. Then, an integrated circuit wafer is manufactured using the integrated circuit wafer design. A defect on the integrated circuit wafer is then located. The control points are adjusted such that they correspond with the defect.

20 Claims, 3 Drawing Sheets

METHOD AND APPARATUS FOR DESIGNING AND INTEGRATED CIRCUIT

FIELD OF THE INVENTION

The present invention relates to a method and apparatus for designing an integrated circuit.

BACKGROUND OF THE INVENTION

When making an integrated circuit (which may also be referred to as an IC, chip or device), a design layout of the IC is made using, for example, CAD tools. A reticle or mask is then produced for the IC design layout and then photolithography is used to transfer features from the reticle or mask to a die (integrated circuit semiconductor wafer).

Various techniques are used to reduce the level of defects in the resultant die. For instance, prior to the production of the reticle, the design layout may be optimized using optical proximity correction (OPC) to create a reticle layout. This optimization process amends the physical design layout in order to avoid optical or process distortions also known as patterning defects when features are transferred from the reticle or mask that may cause failures of the device. The OPC optimization process discretizes the design layout into moveable segments and adds control points to the design where it is determined that patterning defects may occur. The segmented features of the IC design are then amended using a model of the patterning process to calculate patterning error information at these control points until it is determined that the patterning defects are fixed. Once the patterning defects are fixed there is no further use for the control points.

Once the reticle is produced and wafer dies have been manufactured, features on these wafer dies may be measured or micrographed by scanning electron microscope (SEM) techniques to evaluate if there are patterning defects which were not adequately fixed during OPC. Obviously, individually measuring or micrographing each feature on a multi-million gate device is unfeasible. Therefore, certain representative features are chosen. These representative features can be determined by rule-based guidelines or by lithographic simulation predictions.

Where wafer patterning defects are found that would result in an unacceptable failure rate for the IC, the reticle layout must be adjusted to avoid these critical defects. This results in further iterations of OPC, build and test of the die until no critical defects are found or the die meets other success criteria. This is a costly and labor intensive process and may result in many time consuming iterations until a successful reticle layout is found.

SUMMARY OF THE INVENTION

The present invention provides a method and apparatus for designing an integrated circuit as described in the accompanying claims.

BRIEF DESCRIPTION OF THE FIGURES

The present invention may be put into practice in a number of ways and an embodiment will now be described by way of example only and with reference to the accompanying drawings, in which.

It should be noted that the figures are illustrated for simplicity and are not necessarily drawn to scale.

DETAILED DESCRIPTION OF AN EMBODIMENT

Figure 1:
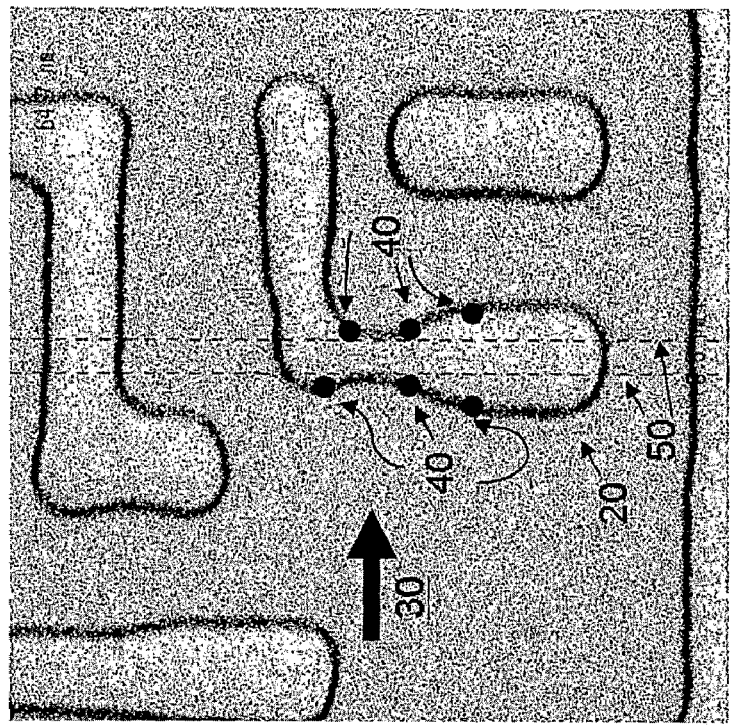
FIG. 1 shows a schematic diagram of a layout of a portion of an integrated circuit according to an embodiment of the present invention, including control points at particular locations, given by way of example.

FIG. 1 shows a schematic diagram of the layout 10 of several features forming part of an integrated circuit (IC). The IC layout is designed using known CAD tools and may be optimized using an optical proximity correction (OPC) technique. OPC may be used to reduce the adverse effects of optical and process distortions occurring during fabrication of a wafer.

During the OPC process certain feature locations may be identified as potential areas for causing defects in the wafer leading to failure of the IC. For instance, the areas around bends in a track may be produced too thin to the extent that they cannot conduct a high enough electrical current leading to burn-out at this point. These potentially problematic feature locations may be tagged by the addition of control points to the design. These control points are used to reference particular feature locations and are not fabricated on the final wafer. The control points are used during the OPC optimization process to amend particular features.

In the method in accordance with the present invention, the control points are also used during wafer patterning defect evaluation. The use of control points during wafer patterning defect evaluation is not known from previous techniques. In one embodiment, instead of discarding the control points after the OPC optimization process is completed, the control points are instead stored for use during wafer patterning defect evaluation. In another embodiment, an algorithm for determining placement of the control points may be stored for use during wafer patterning defect evaluation. In yet another embodiment, the control points may be regenerated on a subset of the original layout for use during wafer patterning defect evaluation.

Control points are locations for calculation of edge position (EP), edge position error (EPE), or critical dimension (CD) for wafer features. The CD of a feature indicates the width at a specific location on that particular feature or the space at a specific location between two features. The EP, EPE or CD for any particular location may be estimated during the OPC optimization step. During a step in the OPC optimization process the EPs, EPEs or CDs for potentially problematic features are calculated at the control points. Therefore, each control point will have certain attributes that may be recorded for later retrieval. These attributes include location, tolerance, critical dimension, EP, EPE, CD, size and accuracy. The attributes for the control points may be stored in a database or other suitable computer file format.

Control points are generated during the OPC procedure before the movement of the design segments by the OPC software. Control points are generated by an algorithm for determining where OPC segment movements will be required in a design. To place control points, the algorithm may use geometrical rules such as distance from a design corner, or the results of patterning simulations such as light intensity minima or both.

Figure 2:
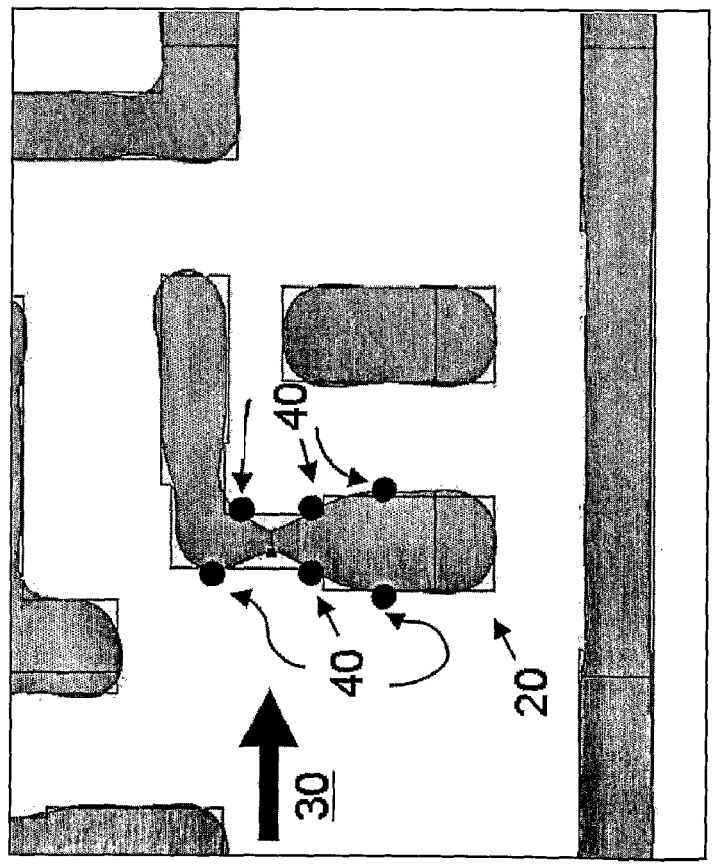
FIG. 2 shows a SEM image of a portion of the integrated circuit corresponding to the portion shown in FIG. 1, given by way of example.

FIG. 1 and FIG. 2 illustrate an example situation, where control points are not located correctly. This may be due, for example, to deficiencies in the algorithm used to generate control points. For example, if geometric rules are used to determine the placement of control points near design corners, the results of the geometric rules may not provide for optimum control point placement when there are many design corners in close proximity to each other on a given feature. In this example OPC optimization has not effectively optimized the design layout due to the misplaced control points.

FIG. 1 contains a simulation of a particular problematic feature 20 that has a pinch point indicated by arrow 30. Three pairs of control points 40 surround the pinch point but none line up precisely with it. These control points 40 were added during an OPC optimization process.

Once a wafer has been fabricated wafer patterning defect evaluation may be used to analyze potentially problematic features. These checks may involve measuring the actual minimum wafer CD of problematic features and comparing this measurement to a predetermined CD tolerance threshold. If the actual CD measured is less than the CD tolerance threshold, a patterning defect may be highlighted. These checks may also involve measuring the distance between the detected patterning defect location and the nearest control point. If this measured distance is greater than a predetermined threshold distance, a control point placement error may be highlighted.

FIG. 2 shows a SEM micrograph of a portion 110 of the IC wafer corresponding to the portion of IC design shown in FIG. 1. Corresponding SEM feature 20 is shown with control points 40 highlighted. SEM CD measurements taken at control points 40 in FIG. 2 may be compared to the patterning model's prediction of feature 20 CDs at the control points in FIG. 1. The predicted vs. measured CD comparison shows that the patterning model has sufficient accuracy, as can be seen by comparing the model predicted feature 20 in FIG. 1 to the SEM image of feature 20 in FIG. 2. Dotted lines 50 indicate the measured CD of the pinch point on feature 20. However, none of the control points 40 are placed at the narrowest point in feature 20. Thus, although the patterning model had sufficient accuracy, the OPC optimization failed to identify the most critical portion of feature 20 (i.e. the pinch point 30). Furthermore, none of the CDs of the feature 20 measured at each of the control points 40 are below the predetermined CD tolerance threshold. This portion of the wafer will therefore, pass this particular validation test when looking at control points 40 without the most critical feature being measured. Nevertheless, the IC manufactured according to the design may fail at this point. Further measurements may be made using the SEM and these measurements will not necessarily use control points 40 but instead are used to look for features that may potentially cause failures.

Figure 4:
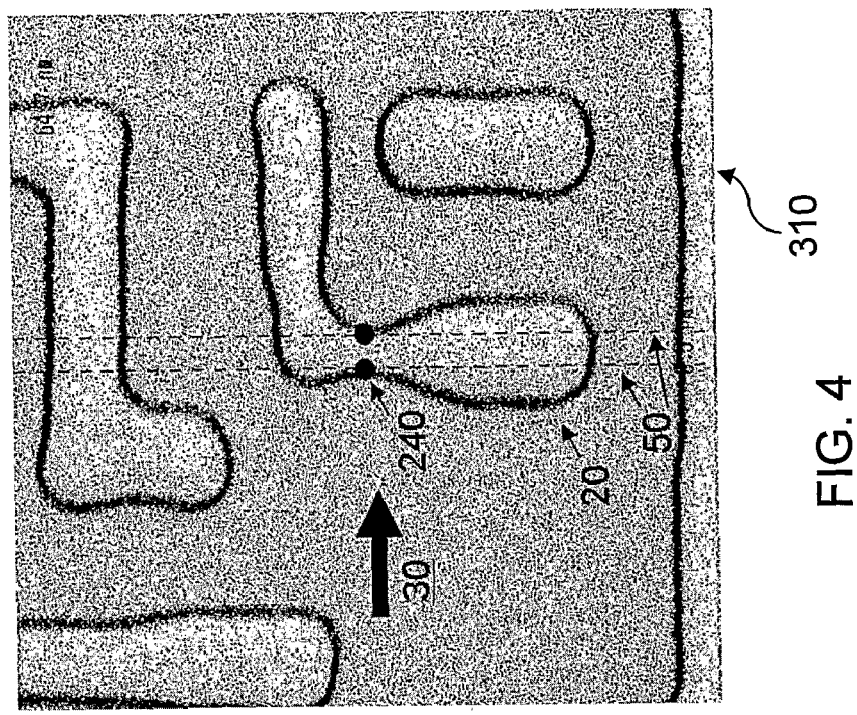
FIG. 4 shows a SEM image of a portion of the integrated circuit corresponding to the portion shown in FIG. 3, given by way of example.
Figure 3:
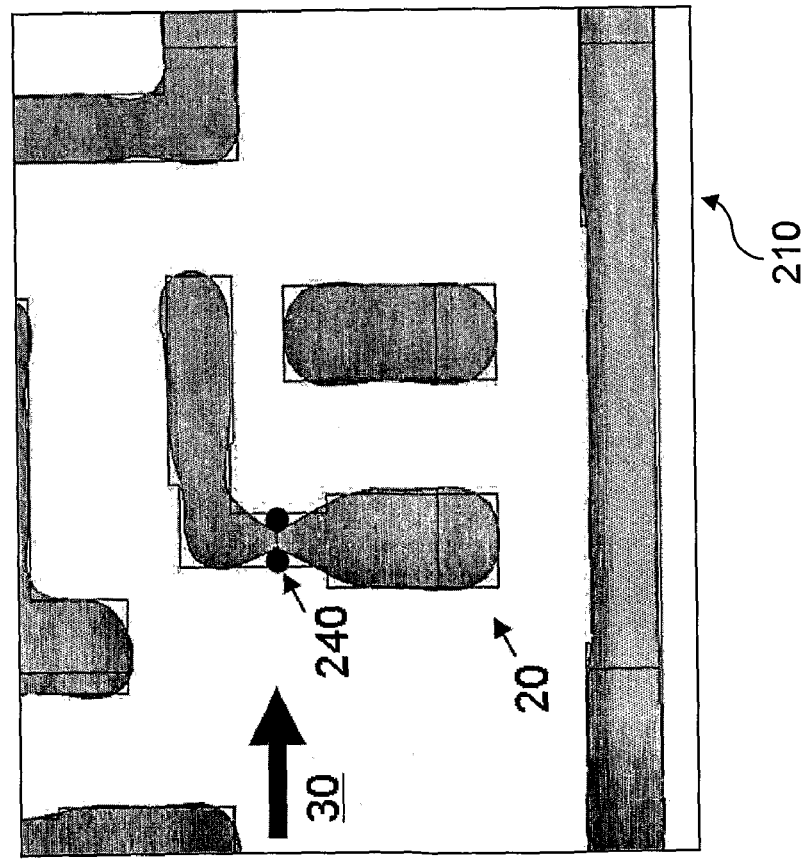
FIG. 3 shows a schematic diagram of the layout of the portion of the integrated circuit shown in FIG. 1 but with control points in different locations, given by way of example.

FIG. 3 and FIG. 4 illustrate an example situation, where control points are placed correctly, i.e. the minimum distance between the control points 40 and the patterning defect location 30 is less than a predetermined threshold value. In this example although OPC optimization occurred at the correct location the layout of the feature was not compensated to a sufficient degree to avoid failures. The failure in this example to compensate the feature adequately is due to a limitation of the patterning model accuracy. Because of this model inaccuracy, simulated CD, EP or EPE measurements made at the control points may not effectively test the suitability of the IC design. Again, the control points 40 were positioned during an OPC optimization process.

FIG. 3 shows a similar schematic diagram to that of FIG. 1. However, the portion of the IC design 210 contains only a single pair of control points 240. The control points are located at the correct position, i.e. at the narrowest point of the feature 20. However, the measured CD at the control points 240 is less than an acceptable CD.

FIG. 4 shows a SEM micrograph of a portion 310 of the IC wafer corresponding to the portion of IC design 210 shown in FIG. 3. Again, the pair of control points 240 are overlaid on this micrograph portion 310. The patterning model predicted CD of the feature 20 at control points 240 is greater than the minimum acceptable CD, and so the validation test using the control points will pass but as the actual minimum wafer CD of feature 20 measured by the SEM at the control points 240 is narrower than the minimum acceptable CD the feature 20 may still cause a failure once the IC is in use.

Since the attributes of the control points and the accuracy of the patterning model both affect the success of OPC optimization it may therefore, be necessary to optimize these attributes and/or the model accuracy before subsequent OPC optimization processes commence.

Figure 5:
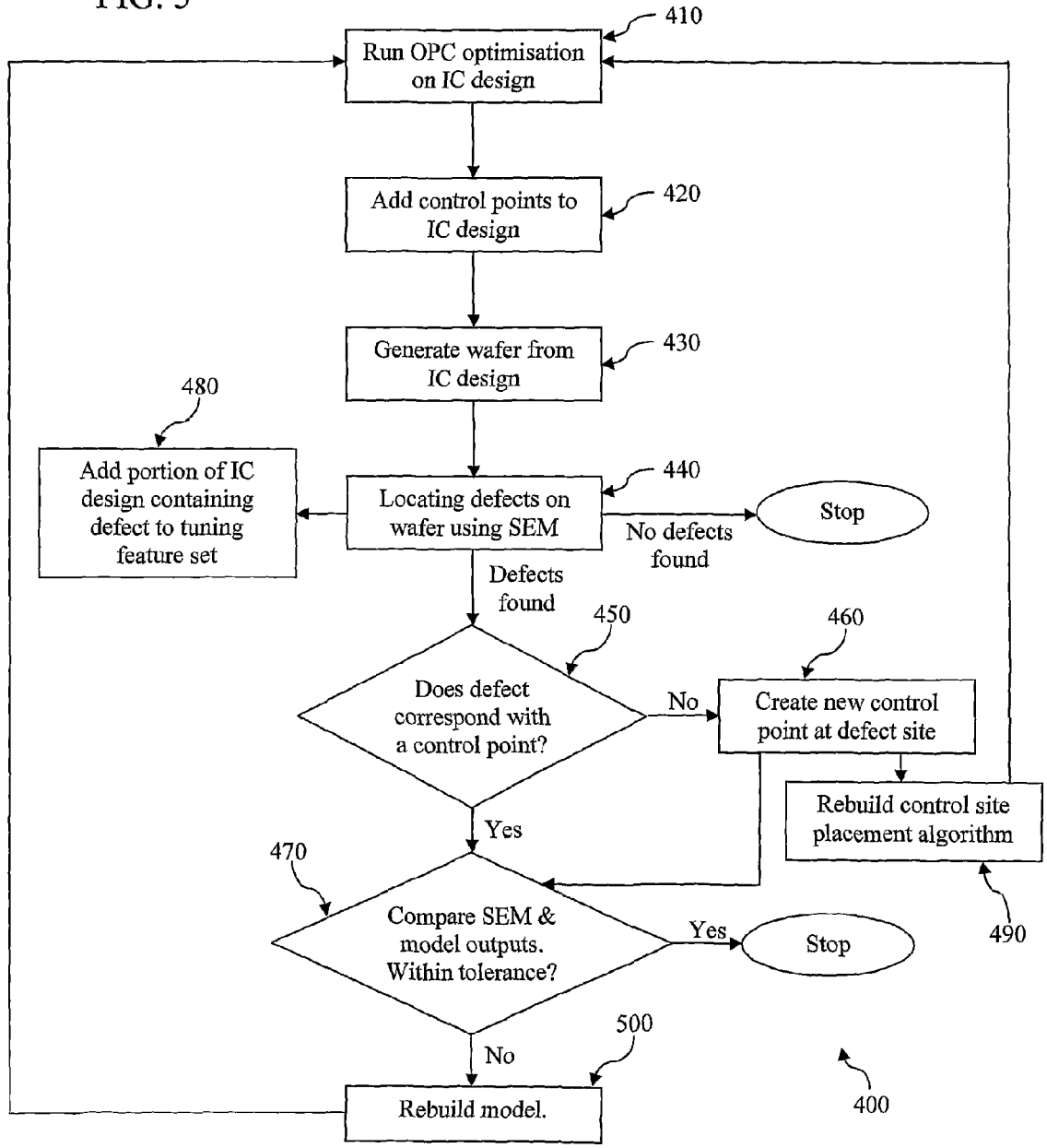
FIG. 5 shows a flowchart of a method for designing an integrated circuit according to an embodiment of the present invention, given by way of example.

FIG. 5 shows a flowchart showing the steps for designing an IC. FIG. 5 is an embodiment of the method according to the invention. Flowchart 400 starts after an initial IC design has been completed. Implementation of flowchart 400 reduces the risk of encountering similar situations to those described with respect to FIGS. 1 to 4.

OPC optimization is run on the initial IC layout design 410. During OPC optimization control points may be added at a suitable step, to identify potentially problematic features 420. Control points may be added by an algorithm for determining where OPC segment movements will be required in a design. To place control points, the algorithm may use geometrical rules or alternatively, the results of patterning simulations or both. In one embodiment, the control points and their associated attributes may be stored for later retrieval. In another embodiment, the placement algorithm may be stored for later regeneration of the control points and their associated attributes.

Once an OPC optimization process has been run, an IC wafer may be fabricated using the optimized IC design 430.

Then, the IC wafer may be examined using a SEM or other suitable imaging or scanning technique in order to locate defects 440. The potential defect locations to examine with the SEM may be determined using simulation analysis of the OPC optimized design, using a wafer based defect detection method such as die-die optical wafer inspection, by a review of programmed potential defective structures such as structures drawn at design rule limits, or other suitable detection method. If no defects are found the process may stop and the wafer may go into full production in the usual way.

The portion of the IC layout design containing a defect found in step 440 may be added to a tuning feature set 480 and used to find similar defects during subsequent optimization of previous IC designs, of this IC design or of future IC designs. For example, a portion of a layout containing a defect found in step 440 may be compared against other designs using pattern matching algorithms in order to determine if these designs will contain the same defect. In another example, the portion of the layout containing a defect found in step 440 can be placed into a feature set used for training empirical process models. In yet another example, the portion of the layout containing a defect found in step 440 can be placed into a feature set for optimizing or verifying OPC characteristics such as control point placement. If defects are found it may be determined whether or not they correspond to control points or pairs of control points 450. If the defects do not correspond to existing control points this indicates that the OPC process may have misplaced the control points. For instance, the control points may be in the wrong locations (see FIGS. 1 and 2 and the corresponding description). In this case control points may be moved or added to the defective feature 460 to ensure that control points correspond to the defective feature. In a further embodiment of the method of the invention step 480 may be left out.

The algorithm for placing control sites may be rebuilt 490 using the layout portion containing a defect found in step 440. In a further embodiment of the method of the invention step 490 may be left out.

After it is known that control points correspond to the defective feature, simulated measurements of CD, EP or EPE can be taken at the defect location using the process model. The simulated results can be compared to the SEM measurements at the defective location 470. If the difference between the SEM measured and process model predicted results 470 is less than a predetermined threshold value, the process may stop. If the difference between the SEM measured and process model predicted results 470 is greater than a predetermined threshold value, then this indicates the process model has insufficient accuracy and should be amended or rebuilt 500. The process model may be rebuilt using the feature set used for training empirical process models. The process model uses an empirical model or function which is used to transform or analyze an approximate physically based simulation of light intensity and to predict CD, EP, EPE or other OPC parameters. Some process model parameters may be empirically fit to match experimental SEM CD, EP or EPE data using a set of model training layout structures. Possible reasons for discrepancies in measured vs. process model predicted values include insufficient training layout structure coverage, poor empirical parameter values, and poor physical approximations in simulated light intensities.

If the process model is amended or rebuilt, the stored attributes associated with the incorrect control points will require updating. Once the process model is improved, the OPC process may be re-run and the process repeated until all significant defects have been removed. It may be possible to carry out a partial OPC optimization rather than to optimize the entire IC design. For repeated structures, updates to one instance may be duplicated for all instances.

In this way the information used to generated control points during OPC optimization may be re-used and tuned to further optimize the OPC process. This results in a more efficient design process and a final design may be found using fewer OPC, build and test cycles.

The method described above may be carried out in an automated manner using suitable apparatus or a computer programmed to perform each of the method steps.

As will be appreciated by the skilled person, details of the above embodiment may be varied without departing from the scope of the present invention, as defined by the appended claims.

For example, the control points may be added to the design at another stage in the design process rather than during OPC optimization.

The defects that may be detected include tracks that are too narrow to allow sufficient current to flow, tracks that are too close together, tracks that are too short or weak connections.

Defects may be found on the wafer using various techniques including scanning electron microscope measurements.

The separation of a pair of control points may be used to define an estimated CD for a particular feature.

Control points may be used to assist with the location of defects on the wafer as they may be located in proximity to parts of features susceptible to defects.

The invention claimed is:

1. A method of designing an integrated circuit comprising the steps of:
   adding a plurality of control points to an integrated circuit wafer design, wherein each control point has at least one attribute;
   manufacturing an integrated circuit wafer using the integrated circuit wafer design;
   locating a defect on the integrated circuit wafer;
   adjusting the plurality of control points such that they correspond with the defect.

2. The method of claim 1, wherein the adjusting step further comprises changing the at least one attribute.

3. The method of claim 2, wherein the adjusting step further comprises adding a control point.

4. The method of claim 2, further comprising the step of recording a portion of the integrated circuit design containing the defect, in a tuning feature set.

5. The method of claim 2, wherein the plurality of control points are added during an optical proximity correction (OPC) optimisation process.

6. The method of claim 1, wherein the at least one attribute is selected from the group consisting of location, tolerance, critical dimension (CD) edge position (EP) edge position error (EPE) and size.

7. The method of claim 6, wherein the at least one attribute is selected from the group consisting of location, tolerance, critical dimension (CD) edge position (EP) edge position error (EPE) and size.

8. The method of claim 6, wherein the plurality of control points are added during an optical proximity correction (OPC) optimisation process.

9. The method of claim 1, wherein the adjusting step further comprises adding a control point.

10. The method of claim 1, further comprising the step of recording a portion of the integrated circuit design containing the defect, in a tuning feature set.

11. The method of claim 1, wherein the plurality of control points are added during an optical proximity correction (OPC) optimisation process.

12. The method of claim 1, further comprising the step of storing the plurality of control points.

13. The method of claim 1, further comprising the step of determining an error between a process model prediction of the at least one attribute and a physical measurement of the at least one attribute.

14. The method of claim 13, wherein the determining the error step further comprises comparing the error within a predetermined threshold error value to determine if the process model should be amended.

15. The method of claim 13, wherein the physical measurement is a scanning electron microscope (SEM) measurement.

16. The method of claim 1, wherein the locating step is performed using a scanning electron microscope (SEM).

17. A computer program comprising program instructions that, when executed on a computer cause the computer to perform the method of claim 1.

18. An integrated circuit manufactured according to the method of claim 1.

19. Apparatus for designing an integrated circuit comprising:
- a computer system to add a plurality of control points to an integrated circuit wafer design, wherein each control point has at least one attribute;
- a defect tool to locate a defect on the integrated circuit wafer manufactured using the integrated circuit wafer design;
- the computer system to adjust the plurality of control points such that they correspond with the defect.

20. The apparatus of claim 19, wherein the defect tool comprises an error is a scanning electron microscope (SEM).

* * * * *